US005770032A

United States Patent [19]
Cane

[11] Patent Number: 5,770,032
[45] Date of Patent: Jun. 23, 1998

[54] METALLIZING PROCESS

[75] Inventor: Frank N. Cane, San Jose, Calif.

[73] Assignee: Fidelity Chemical Products Corporation, Newark, N.J.

[21] Appl. No.: 734,245

[22] Filed: Oct. 16, 1996

[51] Int. Cl.$^6$ .............................. C25D 5/34; C25D 5/02; C25D 5/54; C25D 5/56

[52] U.S. Cl. ..................... 205/210; 205/125; 205/126; 205/163; 205/167

[58] Field of Search .................... 205/125, 126, 205/163, 167, 210

[56] References Cited

U.S. PATENT DOCUMENTS

| | | | |
|---|---|---|---|
| 3,011,920 | 12/1961 | Shipley, Jr. | 117/213 |
| 3,532,518 | 10/1970 | D'Ottavio | 106/1 |
| 3,616,296 | 10/1971 | Bernhardt et al. | 205/167 |
| 3,691,109 | 9/1972 | Kremer et al. | 427/304 |
| 4,448,804 | 5/1984 | Amelio et al. | 427/98 |
| 4,515,829 | 5/1985 | Deckert et al. | 427/97 |
| 4,600,609 | 7/1986 | Leever et al. | 427/438 |
| 4,608,275 | 8/1986 | Kukanskis et al. | 427/98 |
| 4,634,468 | 1/1987 | Gulla et al. | 106/1.11 |
| 4,683,036 | 7/1987 | Morrissey et al. | 204/15 |
| 4,684,550 | 8/1987 | Milius et al. | 427/437 |
| 4,756,930 | 7/1988 | Kukanskis et al. | 427/97 |
| 4,759,952 | 7/1988 | Brasch et al. | 427/98 |
| 4,782,007 | 11/1988 | Ferrier | 430/313 |
| 4,863,758 | 9/1989 | Rhodenizer | 427/97 |
| 4,891,069 | 1/1990 | Holtzman et al. | 205/125 |
| 4,904,506 | 2/1990 | Burnett et al. | 427/443.1 |
| 4,931,148 | 6/1990 | Kukanskis et al. | 205/126 |
| 4,933,010 | 6/1990 | Okabayashi | 106/1.11 |
| 5,213,841 | 5/1993 | Gulla et al. | 205/167 |
| 5,358,602 | 10/1994 | Sutcliffe et al. | 156/656 |
| 5,472,563 | 12/1995 | Kogawa et al. | 156/629.1 |
| 5,474,798 | 12/1995 | Larson et al. | 427/58 |

*Primary Examiner*—Kathryn L. Gorgos
*Assistant Examiner*—Edna Wong
*Attorney, Agent, or Firm*—Klauber & Jackson

[57] ABSTRACT

A process for metallizing a surface of a substrate. Preferably, the substrate is composed of a dielectric material such as a circuit board which has copper cladding on at least one face and at least one through-hole to provide a site for electrical connection to an adjacent circuit board. After cleaning the surface, it is sensitized by contacting such surface with an aqueous solution comprising a stannous salt, a precious metal salt and a source of chloride ions.

44 Claims, No Drawings

5,770,032

METALLIZING PROCESS

FIELD OF THE INVENTION

The invention relates to a process for metallizing a surface of a substrate (typically a dielectric material). The resultant product may thereafter be electrolessly plated with a metal such as nickel. The plated substrate is useful for the manufacture of printed circuit boards.

BACKGROUND OF THE INVENTION

In double-sided and multilayer printed circuit boards, it is necessary to provide conductive interconnection between and among the various layers of the board containing conductive circuitry. This is achieved by providing metallized, conductive through-holes in the board requiring electrical connection. The predominant method for providing conductive through-holes is by electroless deposition of metal on the non-conductive through-holes drilled or punched through the board.

There are many prior art methods for the application of a metal coating to an electrically non-conductive, i.e., dielectric, surface in order to produce printed circuit boards which will conduct an electrical current in accordance with the patterns of conductive metal coated on their surface. These methods have involved the following three basic steps: (1) treating the surface of the substrate with an agent to make it catalytically receptive to electrolessly-formed metal deposits; (2) electrolessly depositing a metal on the surface of the treated substrate; and (3) electrodepositing a plating metal over the electrolessly-formed metal deposits. The pattern of the printed circuit is achieved through the use of screen or photoresist imaging.

The substrate may initially be copper-clad or not; however, most boards have copper cladding at the beginning of the process, which is subsequently removed in the non-pattern areas. The latter processes are referred to as subtractive.

In typical processes associated with printed circuit board manufacture wherein through-hole metallization is employed, the catalytic material most often comprises palladium metal. The process of applying the catalytic material to the substrate surfaces typically involves contact of the surfaces with a true or colloidal solution of palladium and tin compounds. See, e.g. U.S. Pat. Nos. 3,011,920 and 3,532,518. In most cases, catalysis of the substrate surface is followed by an acceleration step which exposes or increases exposure of the active catalytic species.

Following deposition of the catalytic material on the substrate surface, the surface is electrolessly plated by contact with an aqueous metal solution in which plating by chemical reduction leads to the deposit of metal from the bath onto the catalyzed surface. The through-holes are usually plated with a copper reduction procedure known to the art as electroless copper plating, such as that described by Clyde F. Coombs, Jr. in *Printed Circuit Handbook*, 3rd Edition, McGraw-Hill Book Co., N.Y., N.Y., 1988, Chapter 12.5, which is incorporated herein by reference in its entirety.

Methods of the type described above have proven to be expensive and demanding of strict process controls. Further limitations on the use of these processes result from the chemical susceptibility of the electroless metal layer, and by the required use of hazardous and toxic chemical agents. Efforts to overcome these disadvantages have met with only partial success in the past, and have brought with them their own disadvantages.

In a typical process for the manufacture of a single- or double-sided printed circuit board, suitable substrates generally comprise laminates consisting of two or more plates or foils of copper, which are separated from each other by a layer of non-conductive material. The non-conductive layer or layers are preferably an organic material such as epoxy resin impregnated with glass fibers. Holes are drilled or punched at appropriate locations on the board, providing side-to-side connections when metallized. Thereafter, the board is treated with a cleaning composition, typically alkaline, which removes soils and conditions the through-holes, followed by a slow acid etching treatment which is used for removal of copper surface pretreatments, oxidation, and presentation of uniformly active copper. Typical compositions for this microetching step are persulfates and sulfuric acid-hydrogen peroxide solutions. The board is next catalyzed with a neutral or acid solution of tin/palladium catalyst, which deposits a thin layer of surface-active palladium in the through-holes and on the surface of the board. Any residual tin on the board surfaces and through-holes is removed by treatment with an accelerator composition. The board is then ready for electroless copper plating, which is typically carried out with an alkaline chelated copper reducing solution that deposits a thin copper layer in the through-holes and on the surfaces of the board. After acid-dipping, commonly with sulfuric acid, the board is metal plated with a conventional copper plating solution. It is more usual, however, to precede this metallization step with an imaging step.

In a process known as pattern plating, a dry film photoresist is applied to the board and then exposed to transfer the negative image of the circuit, after which it is developed to remove the unexposed portions. The resist coats the copper that is not part of the conductor pattern. Thickness of the copper pattern is increased by electrolytic copper plating. The imaged dry film resist is then removed, exposing unwanted copper, i.e. copper which is not part of the conductor pattern; the unwanted copper is dissolved with a suitable etchant, e.g. cupric chloride, ferric chloride, ammoniacal copper, sulfuric acid/hydrogen peroxide, etc.

A multilayered printed circuit board is made by a similar process, except that pre-formed circuit boards are stacked on top of each other and coated with a dielectric layer. The stack is pressed and bonded together under heat and pressure, after which holes are drilled and plated in the above-described manner. However, one problem present with the manufacture of multilayer printed circuit board through-holes is that the drilling of the holes causes resin "smear" on the exposed conductive copper metal interlayers, due to heating during the drilling operation. The resin smear may act as an insulator between the later plated-on metal in the through-holes and these copper interlayers. Thus, this smear may result in poor electrical connections and must be removed before the plating-on operation.

Various alkaline permanganate treatments have been used as standard methods for desmearing surfaces of printed circuit boards, including the through-holes. Such permanganate treatments have been employed for reliably removing smear and drilling debris, as well as for texturing or micro-roughening the exposed epoxy resin surfaces. The latter effect significantly improves through-hole metallization by facilitating adhesion to epoxy resin. Other conventional smear removal methods have included treatment with sulfuric acid, chromic acid, and plasma desmear, which is a dry chemical method in which boards are exposed to oxygen and fluorocarbon gases, e.g. $CF_4$.

Generally, permanganate treatments involve three different solution treatments used sequentially. They are (1) a solvent swell solution, (2) a permanganate desmear solution, and (3) a neutralization solution. Typically, a printed circuit board is dipped or otherwise exposed to each solution, with a deionized water rinse between each of the three treatment solutions. When the desmearing process is continued, it results in exposure of about 0.5 mil on the top and bottom surface of the inner-layer copper, allowing it to protrude from the drilled through-hole, promoting better adhesion to the latter-applied metallized layer.

SUMMARY OF THE INVENTION

It is an object of the present invention to provide an improved electroless process for applying a conductive metal layer to a substrate, typically electrically non-conductive in nature, (i.e. dielectric), especially the through-hole walls of printed circuit boards.

It is also an object of the present invention to provide a more economical and environmentally safer process for applying a conductive metal layer to the surfaces of non-conductive layers of printed circuit boards than is presently available with permanganate/electroless processes currently in use.

A further object of the present invention is to provide an improved method of manufacturing printed circuit boards wherein selective electroless metal deposition of through-holes is achieved by use of the preplating operation and the dry film circuit image operation.

The process of the invention comprises sensitization of the surface of a substrate whose surface has been cleaned by conventional methods. Preferably the substrate comprises a dielectric material which has been clad with copper on at least one face thereof and which contains at least one through-hole extending through both faces of the substrate and through the copper cladding. Sensitization of the cleaned surface is accomplished by contacting such surface with a first aqueous solution comprising a stannous salt, a precious metal salt and a source of chloride ions.

DETAILS OF THE INVENTION

In the sensitization step, the first aqueous solution will contain the following:

(a) About 4 to 40 wt. %, preferably 15 to 25 wt. %, based on the weight of the first aqueous solution, of a stannous salt such as stannous chloride, stannous nitrate, stannous sulfate and the like; preferably, the stannous salt comprises stannous chloride.

(b) About 0.1 to 1.0 wt. %, preferably 0.3 to 0.6 wt. %, based on the weight of the first aqueous solution, of a precious metal salt. The precious metal may be platinum, palladium, iridium, silver and gold; the preferred precious metal comprises palladium. The anionic moiety of the precious metal salt may be chloride (preferred), nitrate, sulfate, and the like.

(c) About 1 to 20 wt. %, preferably 5 to 15 wt. %, based on the weight of the first aqueous solution, of a source of chloride ions. Such source may be sodium chloride (preferred), potassium chloride or a mixture thereof.

The sensitization step will involve contact of the cleaned surface of the substrate with the first aqueous solution at a temperature in the range of about 20 to 50° C., for a period of time of about 0.1 to 10 minutes.

After the surface of the substrate has been sensitized, it is subjected to a multi-step process for the metallization of the surface. The multi-step process will typically be one of three basic types:

a) activation of the sensitized surface by contact with a second aqueous solution comprising a precious metal salt and an acid;

b) electrolessly plating the activated surface by contacting such surface with a third aqueous solution comprising a metal salt, a complexing agent and a reducing agent capable of reducing said metal to its elemental form;

c) electrolytically plating the electrolessly plated surface with an electrically conductive metal;

d) contacting the electrolytically plated surface with a dry film photoresist which is thereafter imaged and developed to form a circuit pattern; and e) contacting the surface containing the circuit with an acidic cleaning solution (e.g. 3N sulfuric acid) to neutralize and remove any residual materials therefrom.

The second type of multi-step process is as follows:

a) activation of the sensitized surface by contact with the second aqueous solution;

b) contacting the activated surface with the dry film photoresist which is thereafter imaged and developed to form a circuit pattern;

c) contacting the surface containing the circuit with the acidic cleaning solution to neutralize and remove any residual materials therefrom;

d) electrolessly plating the surface resulting from step c) by contacting such surface with the third aqueous solution; and e) electrolytically plating the electrolessly plated surface with an electrically conductive metal.

The third type of multi-step process is as follows:

a) contacting the sensitized surface with the dry film photoresist which is thereafter imaged and developed to form a circuit pattern;

b) contacting the surface containing the circuit with the acidic cleaning solution to neutralize and remove any residual materials therefrom;

c) activation of the surface resulting from step b) by contact with the second aqueous solution;

d) electrolessly plating the activated surface by contact with the third aqueous solution; and e) electrolytically plating the electrolessly plated surface with an electrically conductive metal.

In the activation step, the second aqueous solution will contain the following:

(i) $10^{-5}$ to $10^{-1}$ wt. %, based on the weight of the second aqueous solution, of a precious metal salt. The precious metal may be platinum, palladium, iridium, silver or gold; the preferred precious metal salt comprises palladium chloride.

(ii) $10^{-2}$ to 20 wt. % (excluding the amount of water ordinarily present in the acid), based on the weight of the aqueous solution, of an acid such as hydrochloric, sulfuric, fluoboric, etc. Preferably, the acid comprises hydrochloric acid which is conveniently utilized in a concentration of about 0.1 to 2 normal.

The activation step will involve contact of the surface of the substrate with the second aqueous solution at a temperature in the range of about 20° C. to 50° C., for a period of time ranging from about 0.1 to 5 minutes.

Preferably, the third aqueous solution comprises $10^{-6}$ to $10^{-3}$ wt. %, based on the weight of the third aqueous solution, of at least one stabilizer which may be lead acetate, chromium acetate, thiodiglycolic acid, etc.

In the third aqueous solution, the metal salt may be a nickel salt (preferred) or a copper salt which is present in an amount of $10^{-3}$ to 10 wt. %, based on the weight of the third aqueous solution. The complexing agent is present in the third aqueous solution in an amount of about 30 to 50 g per liter of the third aqueous solution, and is selected from the group consisting of ethylenediaminetetraacetic acid and its sodium salts thereof, sodium citrate, sodium acetate, succinic acid, potassium sodium tartrate, nitrilotetraacetic acid and its alkali metal salts thereof, gluconic acid and its gluconate ester thereof, triethanolamine, glucono γ-lactone, and ethylenediamine acetates.

The reducing agent is present in the amount of 0.5 to 5 g per liter of the third aqueous solution, and is selected from the group consisting of dimethylamineborane, isopropylamineborane, morpholineborane, alkali metal borohydrides, sodium trimethoxyborohydride and alkali metal hypophosphites.

Typically, the electroless plating step is carried out at slightly elevated temperatures, preferably from about 20° C. to about 50° C., e.g. 30° C. to 40° C. A treatment time of about 1 to 5 min., preferably 2 to 4 min., and most preferably about 3 min., will provide the desired results. Agitation is carried out with care taken to assure that the plating bath solution passes through the through-holes of the substrates. The electroless nickel plating step is followed by a conventional rinsing step.

The electrolytical plating step is practiced in a conventional manner using a bath containing an electrically conductive metal salt such as a copper salt.

Optionally, the imaged and metallized substrate may be contacted with an acid solution to prepare it for the subsequent plating step. The primary purpose of this step is to maintain the pH balance, and therefore stability, between the electroless nickel plating bath, which is essentially neutral, and the electrolytic copper pattern plating bath, which is essentially acidic. Preferably an acid such as sulfuric acid, chromic acid, hydrochloric acid, hydro-fluoric acid, nitric acid, and the like, is used at sufficiently high concentration to achieve the pH adjusting and stabilizing objective. It is preferred to use an aqueous sulfuric acid solution comprising from about 5% to about 20% by volume of concentrated sulfuric acid, and more preferably a 10% solution or acid dip is used. The pH adjusting and stabilizing step is carried out at ambient or slightly elevated temperatures, e.g. from about 20° to about 40° C., preferably from 25° to 35° C. The length of time during which the non-conductive substrate is immersed in the acidic solution will depend on the type and concentration of the particular acid agent used, as well as the temperature at which the acidic solution is maintained. It has been found that a treatment time of from about 0.5 to 2 min., preferably from 0.75 to 1.5 min., will suffice to provide the desired results. Agitation is carried out and care is taken, for ensuring that the acidic solution passes through the through-holes of the non-conductive substrate.

The last step of the second type of process involves the direct plating of a metal onto the imaged and metallized surface of the substrate to provide a pattern plated printed circuit board. This is a conventional step and is usually referred to as pattern plating, since it puts down on the substrate the finished metal pattern which comprises the printed circuit. The substrate is directly electroplated with a layer of metal, which is preferably copper, but may also be nickel or other metals which will provide satisfactory conductivity in the finished circuit board. Copper is the metal of choice for economic and other reasons, although nickel may be chosen for specialty applications such as making microelectronic circuits that must be free of electrostatic interference. The electroplating bath is preferably maintained at ambient or a slightly elevated temperature, preferably from about 20° to 40° C. The electroplating process should be continued for a sufficient period of time to form a deposit of the desired thickness. The time required for such electroplating to be completed is a function of the total area of metallizing, to be covered. Most electroplating is completed in from about 40 to about 90 min., preferably from 45 to 50 min. Typically, the desired thickness of the deposits on the printed circuit boards will be about 0.8 to about 2.0 mil.

The following nonlimiting examples serve to illustrate the invention.

EXAMPLE 1

A two-sided copper clad epoxy-glass laminate board containing through-holes was metallized using the following procedure:

Step 1—The circuit board base material was cleaned and conditioned as follows:
a. the base material was cleaned by immersing it in a bath containing 10% sulfuric acid and acetone at 55° C. for 3 minutes with agitation followed by a water rinse;
b. the cleaned base material was conditioned by immersing it in a bath of potassium permanganate at a pH of 13.5 at 80° C. for 6 minutes with agitation followed by a water rinse;
c. any manganese deposits and copper oxides were removed and the through-hole wall surfaces were conditioned by immersing the permanganate-treated base material in a bath containing 10% sulfuric acid and hydrogen peroxide at 40° C. for 3 minutes with agitation followed by a water rinse;

Step 2—The first phase of catalyzing the base material was carried out as follows: a sensitizing layer was deposited on the base material by immersing the base material in a bath containing stannous chloride, sodium chloride and palladium chloride in 37% HCl at 35° C. for 2 minutes; this was followed by a water rinse and drying.

Step 3—The desired printed circuit pattern was imaged on the base material by the following procedure:
a. a photopolymerizable coating was applied to the surface of the sensitized base material by laminating a dry photosensitive photoresist film to the dry surface of the base material at 50° C.;
b. the photoresist was imaged by aligning with its surface an illumination mask, the masked area of which corresponded to the positive of the desired circuit pattern and the photoresist was then irradiated through the mask;
c. the photoresist was developed by treating it with potassium carbonate to remove the photosensitive composition from the non-illuminated areas, and to expose the desired circuit pattern on the base material surface.

Step 4—The second phase of catalyzing the base material was completed as follows: the sensitized printed circuit pattern was activated by immersing the base material in a bath containing 2.5 g of palladium chloride and 300 ml of 37% Hcl per liter of bath solution, at 25° C. for 1 min, with vigorous agitation followed by a water rinse;

Step 5—A first metallized coating and a cleaning of the base material was carried out as follows:
a. the catalyzed printed circuit pattern on the base material was electrolessly plated by immersing it in a plating bath containing a source of the nickel plating metal, a complexing agent therefor, a reducing agent, a pH adjustor, a surfactant, and a stabilizer, at 30° C. for 3 min. with vigorous agitation followed by a water rinse;
b. the electrolessly nickel-plated printed circuit pattern base material was cleaned by immersing it in a bath of 10% sulfuric acid, at 25° C. for 1 min., with vigorous agitation.

Step 6—A second metallized coating was formed on the on the base material as followed: copper was electroplated onto the nickel metal deposited on the printed circuit pattern on the base material by immersing the base material in an electroplating bath in which the base material was a continuously moving cathode and the current density was 5 amps/dm$^2$, at 25° C. for 1 hr., to obtain a deposit thickness of 1.5 mil.

EXAMPLE 2

Drilled double-sided and multilayer printed circuit boards and their through-holes were prepared for copper electroplating by first mechanically scrubbing the surfaces of the boards and then immersing them in the following sequence of aqueous baths at the temperatures and for the times indicated in the table of values set out below.

TABLE 1

| PROCEDURE/STEP | TEMP °C. | TIME Min | PROCEDURE/STEP | TEMP °C. | TIME Min |
|---|---|---|---|---|---|
| 1. Epoxy swell | 55 | 5 | 13. Activator | 30 | 1 |
| 2. Rinse in tap water | | 1 | 14. Rinse in tap water | | 1 |
| 3. Rinse in tap water | | 2 | 15. Rinse in tap water | | 1 |
| 4. Permanganate desmear | 175 | 12 | 16. Dry | | as required |
| 5. Rinse in tap water | | 2 | 17. Dry film imaging: laminate, expose, develop | | as required |
| 6. Rinse in tap water | | 3 | 18. Acid cleaner | 30 | 2 |
| 7. Neutralizer-conditioner | 85 | 3 | 19. Rinse in tap water | | 1 |
| 8. Rinse in tap water | | 1 | 20. Electroless nickel | 85 | 3 |
| 9. Rinse in tap water | | 1 | 21. Rinse in tap water | | 2 |
| 10. Sensitizer | 85 | 3 | 22. 10% Sulfuric acid dip | | 1 |
| 11. Rinse in tap water | | 2 | 23. Acid copper plating | | as required |
| 12. Rinse in tap water | | 1 | 24. Rinse in tap water | | 2 |

EXAMPLE 3

In order to demonstrate that the processes of the present invention provide plating adhesions which are equal to or better than those obtained with conventional electroless copper processes, a number of different substrates were subjected to the process of the present invention and to a conventional electroless copper process. The plated substrates were then subjected to testing to determine the peel strength, in lbs./inch, of the platings. The results are set out in Table 2 below.

TABLE 2

| SUBSTRATE | ELECTROLESS COPPER | PRESENT INVENTION |
|---|---|---|
| FR-4 (tetrafunctional) | 2.60 | 2.60 |
| FR-4 (multifunctional) | 2.45 | 2.55 |
| Polyimide | 2.05 | 2.05 |
| Teflon ® | 2.00 | 2.05 |
| BT | 1.20 | 1.20 |
| Copper-Invar-Copper | 2.60 | 2.60 |
| GLASS STYLE COVERAGE:* | | |
| 7628/7629 | 8–9 | 9–10 |
| 2113/2313 | 9–10 | 9–10 |
| 1080 | 9–10 | 9–10 |

*Coverage is based on the backlight testing scale of 0–10.

EXAMPLE 4

The last step of one of the processes of the present invention, in which the final metal layer is electrolytically plated onto the base material to form the printed circuit board final product, was carried out by processing a base through Step 5, a. and b. in Example 1 above, and treating it as follows:

1) the sample was given a copper strike by immersing it in an air-agitated aqueous bath containing 45 g/l of copper sulfate, 5.5% by volume of sulfuric acid, and 50 ppm of cupric chloride;

2) following the treatment immediately above, the sample was immersed in an acid copper bath for about 60 minutes to deposit copper plate on the printed circuit pattern of the base material. The bath contained 210 g/l of copper sulfate, 3.2% by volume of sulfuric acid, 50 ppm of cupric chloride, 0.16% by volume of conventional carrier/brightener/leveler, and 0.6% by volume of a conventional brightener/leveler support additive. After plating, the sample was examined and the adhesion of the metal deposit was found to be excellent.

What is claimed is:

1. In a process for metallizing a surface of a substrate wherein said surface has been cleaned, the improvement which comprises sensitizing the cleaned surface by contact with an aqueous solution consisting of a stannous salt, a precious metal salt and a source of chloride ions consisting of a salt selected from the group consisting of sodium chloride, potassium chloride and mixtures thereof.

2. The process of claim 1 wherein the source of chloride ions comprises sodium chloride.

3. The process of claim 1 wherein the stannous salt comprises stannous chloride.

4. The process of claim 1 wherein the precious metal salt in said aqueous solution comprises a salt of a metal selected from the group consisting of platinum, palladium, iridium, silver and gold.

5. The process of claim 4 wherein the precious metal salt comprises palladium chloride.

6. In a process for preparing a printed circuit board wherein a board comprising a dielectric material is copper cladded on at least one face thereof and contains at least one through-hole extending through both faces of the board and through the copper cladding to provide at least one site for electrical connection to any adjacent printed circuit board, and the copper-clad face is cleaned, the improvement which comprises sensitizing the cleaned surface by a first aqueous solution consisting of a stannous salt, a precious metal salt and a source of chloride ions consisting of a salt selected from the group consisting of sodium chloride, potassium chloride and mixtures thereof.

7. The process of claim 6 wherein the source of chloride ions comprises sodium chloride.

8. The process of claim 6 wherein the stannous salt comprises stannous chloride.

9. The process of claim 6 wherein the precious metal salt in said first aqueous solution comprises a salt of a metal selected from the group consisting of platinum, palladium, iridium, silver and gold.

10. The process of claim 9 wherein the precious metal salt comprises palladium chloride.

11. The process of claim 6 wherein the substrate comprises a dielectric material which has been clad with copper on at least one face thereof and which contains at least one through-hole extending through both faces of the substrate and through the copper cladding.

12. The process of claim 6 wherein the sensitized surface is:
   a) activated by contact with a second aqueous solution comprising a precious metal salt and an acid;
   b) the activated surface is electrolessly plated by contact with a third aqueous solution comprising a metal salt, a complexing agent and a reducing agent which reduces said metal to its elemental form;
   c) the electrolessly plated surface is electrolytically plated with an electrically conductive metal;
   d) the electrolytically plated surface is contacted with a dry film photoresist which is thereafter imaged and developed to form a circuit pattern; and
   e) the surface containing the circuit pattern is contacted with an acidic cleaning solution to neutralize and remove any residual materials therefrom.

13. The process of claim 12 wherein the precious metal salt in said second aqueous solution comprises a salt of a metal selected from the group consisting of platinum, palladium, iridium, silver and gold.

14. The process of claim 13 wherein the precious metal salt comprises palladium chloride.

15. The process of claim 12 wherein the acid in said second aqueous solution comprises hydrochloric acid.

16. The process of claim 12 wherein the third aqueous solution further comprises at least one stabilizer.

17. The process of claim 16 wherein the stabilizer is selected from the group consisting of lead acetate, chromium acetate and thiodiglycolic acid.

18. The process of claim 12 wherein the metal salt in said third aqueous solution comprises a nickel salt.

19. The process of claim 12 wherein the metal salt in said third aqueous solution comprises a copper salt.

20. The process of claim 12 wherein the complexing agent in said third aqueous solution is selected from the group consisting of ethylenediaminetetraacetic acid and its sodium salts thereof, sodium citrate, sodium acetate, succinic acid, potassium sodium tartrate, nitrilotetra-acetic acid and its alkali metal salts thereof, gluconic acid and its gluconate ester thereof, triethanolamine, glucono γ-lactone, and ethylenediamine acetates.

21. The process of claim 12 wherein the reducing agent in said third aqueous solution is selected from the group consisting of dimethylamineborane, isopropylamineborane, morpholineborane, alkali metal borohydrides, sodium trimethoxyborohydride and alkali metal hypophosphites.

22. The process of claim 12 wherein the electrically conductive metal comprises copper.

23. The process of claim 6 wherein the sensitized surface is:
   a) activated by contact with a second aqueous solution comprising a precious metal salt and an acid;
   b) the activated surface is contacted with a dry film photoresist which is thereafter imaged and developed to form a circuit pattern;
   c) the surface containing the circuit pattern is contacted with an acidic cleaning solution to neutralize and remove any residual materials therefrom;
   d) the surface which has been contacted with the acidic cleaning solution is electrolessly plated by contact with a third aqueous solution comprising a metal salt, a complexing agent and a reducing agent which reduces said metal to its elemental form; and
   e) the electrolessly plated surface is electrolytically plated with an electrically conductive metal.

24. The process of claim 23 wherein the precious metal salt in said second aqueous solution comprises a salt of a metal selected from the group consisting of platinum, palladium, iridium, silver and gold.

25. The process of claim 24 wherein the precious metal salt comprises palladium chloride.

26. The process of claim 23 wherein the acid in said second aqueous solution comprises hydrochloric acid.

27. The process of claim 23 wherein the third aqueous solution further comprises at least one stabilizer.

28. The process of claim 27 wherein the stabilizer is selected from the group consisting of lead acetate, chromium acetate and thiodiglycolic acid.

29. The process of claim 23 wherein the metal salt in said third aqueous solution comprises a nickel salt.

30. The process of claim 23 wherein the metal salt in said third aqueous solution comprises a copper salt.

31. The process of claim 23 wherein the completing agent in said third aqueous solution is selected from the group consisting of ethylenediaminetetraacetic acid and its sodium salts thereof, sodium citrate, sodium acetate, succinic acid, potassium sodium tartrate, nitrilotetraacetic acid and its alkali metal salts thereof, gluconic acid and its gluconate ester thereof, triethanolamine, glucono γ-lactone, and ethylenediamine acetates.

32. The process of claim 23 wherein the reducing agent in said third aqueous solution is selected from the group consisting of dimethylamineborane, isopropylamineborane, morpholineborane, alkali metal borohydrides, sodium trimethoxyborohydride and alkali metal hypophosphites.

33. The process of claim 23 wherein the electrically conductive metal comprises copper.

34. The process of claim 6 wherein the sensitized surface is:
   a) contacted with a dry film photoresist which is thereafter imaged and developed to form a circuit pattern;
   b) the surface containing the circuit pattern is contacted with an acidic cleaning solution to neutralize and remove any residual materials therefrom;
   c) the surface which has been contacted with the acidic cleaning solution is activated by contact with a second aqueous solution comprising a precious metal salt and an acid;
   d) the activated surface is electrolessly plated by contact with a third aqueous solution comprising a metal salt, a complexing agent and a reducing agent which reduces said metal to its elemental form; and e) the electrolessly plated surface is electrolytically plated with an electrically conductive metal.

35. The process of claim 34 wherein the precious metal salt in said second aqueous solution comprises a salt of a metal selected from the group consisting of platinum, palladium, iridium, silver and gold.

36. The process of claim 35 wherein the precious metal salt comprises palladium chloride.

37. The process of claim 34 wherein the acid in said second aqueous solution comprises hydrochloric acid.

38. The process of claim 37 wherein the third aqueous solution further comprises at least one stabilizer.

39. The process of claim 38 wherein the stabilizer is selected from the group consisting of lead acetate, chromium acetate and thiodiglycolic acid.

40. The process of claim 34 wherein the metal salt in said third aqueous solution comprises a nickel salt.

41. The process of claim 34 wherein the metal salt in said third aqueous solution comprises a copper salt.

42. The process of claim 34 wherein the complexing agent in said third aqueous solution is selected from the group consisting of ethylenediaminetetraacetic acid and its sodium salts thereof, sodium citrate, sodium acetate, succinic acid, potassium sodium tartrate, nitrilotetraacetic acid and its alkali metal salts thereof, gluconic acid and its gluconate ester thereof, triethanolamine, glucono γ-lactone, and ethylenediamine acetates.

43. The process of claim 34 wherein the reducing agent in said third aqueous solution is selected from the group consisting of dimethylaminoborane, isopropylamine-borane, morpholineborane, alkali metal borohydrides, sodium trimethoxyborohydride and alkali metal hypophosphites.

44. The process of claim 34 wherein the electrically conductive metal comprises copper.

\* \* \* \* \*